United States Patent [19]

Wakefield et al.

[11] Patent Number: 4,487,989

[45] Date of Patent: Dec. 11, 1984

[54] CONTACT FOR SOLAR CELL

[75] Inventors: G. Felix Wakefield, Woodland Hills; James C. Arnett, La Canada; Henry I. Yoo, Agoura, all of Calif.

[73] Assignee: Atlantic Richfield Company, Los Angeles, Calif.

[21] Appl. No.: 517,184

[22] Filed: Jul. 25, 1983

[51] Int. Cl.³ .......................................... H01L 31/04
[52] U.S. Cl. ..................................... 136/256; 29/572
[58] Field of Search ................................ 136/244, 256

[56] References Cited

U.S. PATENT DOCUMENTS 3,589,946  6/1971  Tarneja et al. ................... 136/256
3,888,698  6/1975  Lindmayer et al. ............... 136/256

FOREIGN PATENT DOCUMENTS 1455903  11/1976  France ............................ 136/256

OTHER PUBLICATIONS

A. Flat et al., "Predicted Effect of Grid Line Aspect Ratio on the Performance of Solar Cells," *Solar Energy*, vol. 25, pp. 283-284, (1980).
Solarex Corporation Product Data Sheet 6011, (1977).
Arco Solar Photovoltaic Modules Product Literature, (1982).
Solavolt International Product Literature-MSP13E10; MSP13E20; and MSP43E40 Modules, (Nov. 1982).
M. M. Koltun, "Selective Optical Surfaces for Solar Energy Converters," Allerton Press, (New York, 1981), pp. 27-37, 85-116.
M. Giuliano et al., "The Gridded Back Contact and its Effect on Solar Cell Performance", *Conf. Record*, 15th IEEE Photovoltaic Specialists Conf. (1981), pp. 111-114.

*Primary Examiner*—Aaron Weisstuch
*Attorney, Agent, or Firm*—Nilsson, Robbins, Dalgarn, Berliner Carson & Wurst

[57] ABSTRACT

A solar cell has a rear electrical contact for the semiconductor body of the cell forming an intersecting pattern which includes rows of contact pads which are parallel to a pair of sides of the body; a set of contact strips which also are parallel to such sides; another set of contact strips which are parallel to another pair of sides of the body perpendicular to the first pair of sides; and yet another set of contact strips which are angularly oriented with respect to both pairs of sides of the body. The contact pattern permits the passage of radiation through the cell which would otherwise decrease efficiency due to heat generation and incorporates additional features designed to balance a desire for transparency to such radiation with a requirement for efficient charge collection along the rear of the cell. The front electrical contact for the semiconductor body forms an intersecting pattern, designed to balance the requirement for the entry of solar radiation into the body with the efficient collection of charges at the front of the solar cell, which is similar in some details to the rear electrical contact but significantly different as to other details.

34 Claims, 10 Drawing Figures

CONTACT FOR SOLAR CELL

BACKGROUND OF THE INVENTION

The field of the invention pertains to solar cells and to methods of manufacturing such solar cells.

Great effort has been and continues to be expended on the wringing of critical increments of efficiency out of solar cells. The reason, of course, is the hope that solar cells can, some day, displace a substantial amount of the more conventional energy sources.

The details of the electrical contacts on the solar cells have been viewed as an area to be pursued.

Traditionally, lines of contact material have been employed in forming the front contact. The idea has been to balance the requirement for space between contact areas for the passage of the solar energy into the semiconductor for conversion, with the requirement that contact areas be sufficiently close to one another to collect charges (representing the electrical energy converted from the solar radiation) reaching the front surface of the cell without unacceptable losses due to travel of the charges along the higher resistance non-contact areas to reach the low resistance contact areas.

With regard to the rear contact, the most traditional form remains a rear contact that essentially covers the whole rear of the solar cell. This avoids any travel of the charges at the rear of the cell along non-contact areas.

Solar cells having this now traditional form are illustrated in the Arco Solar, Inc. brochure *Arco Solar Photovoltaic Modules,* 1982. The cells in the brochure are circular except that they are cut, for handling purposes, along two parallel chords of the circle. The front contact grid has a perimeter contact portion having the shape of the cell. Further, there is a group of contact lines across the cell between opposite parts of the perimeter portion, these lines running in the same direction as the cut-offs; two lines perpendicular to this group of lines, crossing all of the lines of the group except a relatively small number at each end of the group, and terminating before the perimeter portion of the contact at each of their ends; and a straight line at each end of each cross line extending from such end toward the midpoint of the respective cut-off and terminating at the contact perimeter portion. All of these lines essentially are the same width. The contact also has connection elements in two rows running in the same direction as the just-described cross lines, serving as positions to connect the front contact of the cell to the back contact of the next cell in an array of cells. In such an array, elongated metallic connectors are soldered to these elements for that purpose.

It is noteworthy that the positioning and soldering of the elongated connectors is an area which is somewhat critical to obtaining an efficient array manufacturing process—particularly where this process is automated. A common problem is the misalignment of the elongated connectors and missed contact of the connectors with some of the connection elements. Such missed connections make the missed connection elements ineffective and thereby impinge on the charge collection process and on the efficiency of the solar cell.

As to solar cells of a generally rectangular or square shape, the Solavolt International brochure (1982) for that company's MSP13E10, MSP23E20 and MSP43E40 solar cell modules is illustrative in, e.g., showing and describing a front contact pattern which apparently is based upon the concept of a group of parallel contact lines accompanied by the continuous bonding of elongated connectors across the front of the cell and the lines. For purposes of soldering of the connectors, and perhaps the charge collection, although not shown or described, it is understood that segmented cross-contact lines, crossing the group of parallel lines, are present under the elongated connectors.

What is somewhat in the nature of a variation on the just-described concept, which has been the subject of some attention, is a front contact predicated upon the concept of a parallel group of contact lines accompanied by crossing contact portions in the general shape of a curved "W" having width variations, with elongated connectors soldered to the base areas of the "W". Such attention is understood to be in respect to experimental large-sized cells.

As to variations on the traditional solid rear contacts, efficiency considerations have led to an appreciation for certain advantages that can be derived from rear contacts which only partially cover the backs of the cells. At the same time, there has been an appreciation that the potential sacrifice in collection efficiency typically is greater at the back than at the front.

Concerning such sacrifice, in the typical silicon solar cell, there is a front doped semiconductor layer having one conductivity type and a rear doped semiconductor layer of the opposite conductivity type, such layers forming the P/N junction where they come together. The rear layer, on which the rear contact is disposed, will typically have a significantly lower conductivity (higher resistivity) than the front layer. The result is a greater loss due to charges travelling along the rear layer material to reach partial contacts at the rear of the cell.

As to the potential advantages, with respect to the just noted general type of solar cell, these relate to the typical conversion efficiency versus wavelength for such cells. Specifically, the capability to receive solar radiation and convert it to electrical charges (and thus electrical energy) largely exists below the upper limit of visible radiation—i.e. below a wavelength of about 0.7 microns. There is some, less pronounced, effectiveness in the near infrared range—i.e. from about 0.7 microns to about 1.5 microns. However, beyond this there is considered to be essentially no effective conversion. Specifically, such radiation essentially passes through the semiconductor material and presents only the disadvantage of being absorbed in the rear contact material and of heating the rear contact material and the semiconductor. Such heating decreases the efficiency of conversion in the semiconductor by in the range of one-half percent for each degree Centigrade. By the standards of present day concerns with solar cell efficiency, for example, a 3 to 5-degree Centigrade decrease in temperature is a substantial improvement.

M. M. Koltun, *Selective Optical Surfaces for Solar Energy Converters,* 1979 (Russian) (1981 English translation) devotes substantial attention to partial back contacts (along with the partial front contacts) to permit the exit of infrared radiation. See Chapter 1.3, "Optimization of the Parameters of Semiconductor Photocells Transparent Beyond the Long-Wave Edge of the Fundamental Absorption Band", pp. 27–37 (particularly p. 29 and pp. 33–37); Chapter 2.2, "Temperature Stabilization and Shielding of Silicon Cells From Radiation By Optical Coatings", pp. 85–111 (particularly pp.

101–107); Chapter 2.3, "Prospects", pp. 111–116 (particularly pp. 113–115). Such material contains somewhat detailed resistance considerations in terms of rectangular or square cells and of contacts having a perimeter portion and lines of a given width with a given spacing therebetween. It also looks toward partial contacts occupying less than about ten percent in surface area.

M. Giuliano and J. Wohlgemuth, "The Gridded Back Contact And Its Effect On Solar Cell Performance", 15th *IEEE Photovoltaic Conference Proceedings*, April, 1981, pp. 111–114, is similarly directed to enhancing performance from a partial back contact. However, it attributes such enhancement to another phenomenon—reflection at the back of the solar cell (as opposed to absorption by a solid contact) of radiation in the vicinity of the near infrared range, in effect, to give the semiconductor material another chance to convert such radiation to electrical charges and energy. The work described is for a particular type of cell having a back surface field (BSF). The increased efficiency is seen as being due to reflection possibly stemming from surface texturing and being dependent upon the formation process and materials connected with the back surface field. In this regard, it is noteworthy that reflection of the near infrared creates more significant advantages in thinner cells where there is less chance for absorption of the near infrared during its initial passage through the semiconductor material. It is also noteworthy that back surface fields generally are thought useful for semiconductor materials having resistivities of 5 ohm centimeters or greater.

In the Giuliano et al. material, the experimentation is with square cells having front and back partial contacts. The back contact grid apparently is a group of four-legged zigzag lines with two elongated connectors across them leading into a thick rectangular end connector along one end of the rear surface. The front grid apparently is a group of six-legged zigzag lines with three elongated connectors across them and leading into another elongated connector perpendicular to the first connectors near one end of the front surface. There is then a thickened connector block along this other elongated connector near one corner of the surface.

On another related matter, concerning the shaping of solar cells, such shaping can typically result in significant sacrifices in the efficiency of the manufacturing process. Specifically, the sacrifice of material during the shaping and the additional handling of the cells in connection with the shaping can both be costly. With the concern for competitiveness of solar cells with traditional energy forms, this sacrifice in cost is a significant concern.

The present invention addresses in a detailed and comprehensive manner the efficiency considerations connected with the rear contact and with the front contact of a solar cell. It particularly addresses them in the context of a solar cell which is shaped for efficient packing in an array of like solar cells. The achieving of such shape, from an ingot, during the manufacture of the solar cell is also addressed in a convenient, efficient fashion.

SUMMARY OF THE INVENTION

In accordance with the invention, a solar cell includes: a semiconductor body to receive solar radiation and convert the radiation to electrical energy, the body having a first pair of opposed substantially parallel sides and a second pair of opposed substantially parallel sides which are substantially perpendicular to the first pair of sides; a front electrical contact for the semiconductor body; and a rear electrical contact for the semiconductor body forming an intersecting pattern. The intersecting pattern includes: a plurality of rows of pads substantially parallel to the first pair of body sides; a first set of strips substantially parallel to the first pair of body sides; a second set of strips substantially parallel to the second pair of body sides; and a third set of strips angularly oriented with respect to the first and second pairs of body sides.

In accordance with other aspects of the invention, a solar cell includes: a semiconductor body as initially described; a front electrical contact for the body forming an intersecting pattern; and a rear electrical contact for the body. The front electrical contact intersecting pattern includes: a plurality of rows of pads substantially parallel to the first pair of body sides; a first set of strips substantially parallel to the first pair of body sides; a second set of strips substantially parallel to the second pair of body sides; and a third set of strips angularly oriented with respect to the first and second pairs of body sides.

In accordance with other, method aspects of the invention, a method of manufacturing solar cells includes the steps of: providing an elongated ingot of semiconductor material having a curved surface along the direction of elongation; and sawing along the direction of elongation through the ingot at a plurality of positions to provide a first pair of substantially parallel elongated ingot surfaces and a second pair of substantially parallel elongated ingot surfaces. The pairs of surfaces may be mutually perpendicular. Also, the method may include the further step of repeatedly sawing through the ingot transverse to the direction of elongation of the ingot to provide a plurality of semiconductor wafers.

In a solar cell embodiment, in accordance with the above and with more detailed aspects of the invention, the intersecting pattern of the rear electrical contact includes: a plurality of rows of pads substantially parallel to the first pair of semiconductor body sides; a first set of strips of substantially a single first width substantially parallel to the first pair of body sides; a second set of strips of substantially a single width which is that same first width, substantially parallel to the second pair of body sides; a third set of strips angularly oriented with respect to the first and second pairs of body sides which are of substantially a single, second width equal to the first width multiplied by about two; and a fourth set of strips substantially parallel to the first pair of body sides, each intersecting at least the two pads of a row of pads disposed closest to a side of the second pair of body sides, wherein at least the portions of these strips between such two pads are of substantially a single width which is the above second with. In addition, each strip of the third set of angularly oriented strips intersects only a single pad of the rows of pads—the pad of a row disposed second closest to a side of the second pair of semiconductor body sides.

The front electrical contact intersecting pattern of the embodiment, as expected from what has already been indicated, in a number of detailed respects fits the description of the rear contact of the embodiment. However, as will become apparent, the front electrical contact intersecting pattern also diverges from the back electrical contact intersecting pattern in a number of significant respects.

BRIEF DESCRIPTION OF THE DRAWINGS

FIG. 3 is an enlarged view of part of FIG. 1.

DETAILED DESCRIPTION

Figure 1:
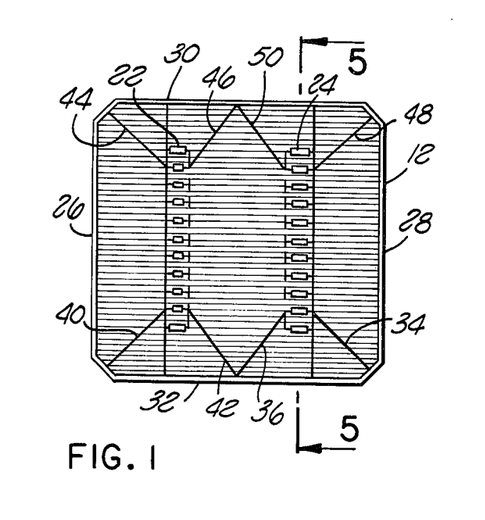
FIG. 1 is a plan view of the front of a solar cell embodiment which is in accordance with the invention.
Figure 2:
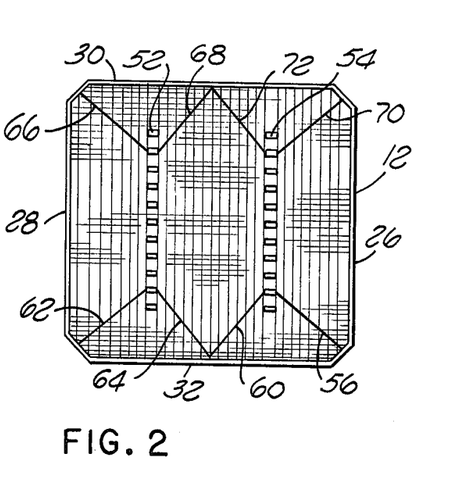
FIG. 2 is a plan view of the rear of the solar cell of FIG. 1.
Figure 5:
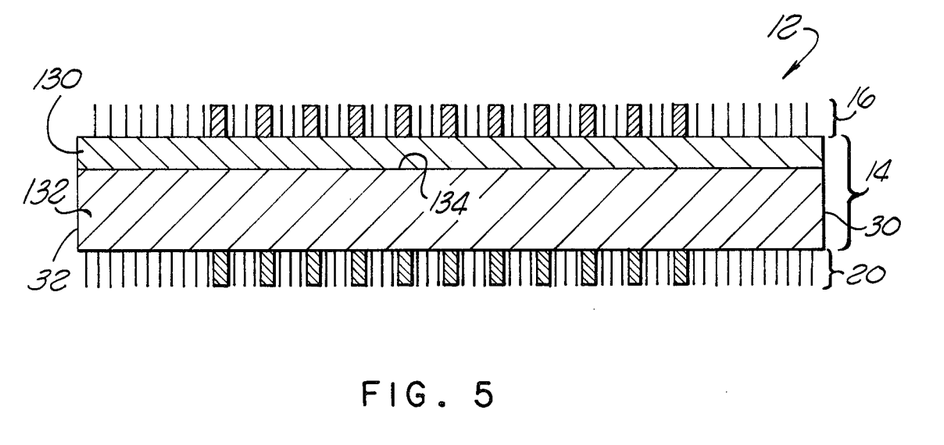
FIG. 5 is a sectional view taken along the line 5—5 of FIG. 1.

By way of introduction, the front and back of a solar cell 12 are shown in FIGS. 1 and 2. The cell has the shape of a square having its corners cut off at angles of 45°. The solar cell has a semiconductor body 14 (see FIG. 5); a front electrical contact 16 (see FIGS. 1, 3 and 5); and a rear electrical contact 20 (see FIGS. 2, 4 and 5). In accordance with the indicated shape of the body of the solar cell, and as is apparent by reference to FIGS. 2 and 3, such body has one pair of opposed, parallel sides and a second pair of opposed, parallel sides which are perpendicular to the first pair. The front electrical contact 16 has two rows of solder pads—a left row 22 and a right row 24 (with reference to the view of FIG. 1). These rows of pads and one of the indicated pairs of body sides are parallel to one another. That pad-row-parallel pair of body sides consists of a left side 26 and a right side 28 (with reference to the view of FIG. 1). The other, pad-row-transverse pair of body sides consists of a top 30 and bottom 32 side (with reference to the view of FIG. 1). The cross-sectional view of FIG. 5 shows these transverse sides. Of course, the pad-row-parallel sides have the same form as these transverse sides.

The front contact has a number of sets of contact strips parallel to each of the pairs of body sides. In addition, it has a set of angle strips, each of which is angularly oriented with respect to each of the pairs of body sides. Referring to FIG. 1, there is a right, lower outside strip 34; a right, lower inside strip 36; a left lower outside strip 40; a left, lower inside strip 42; a left, upper outside strip 44; a left, upper inside strip 46; a right, upper outside strip 48; and a right, upper inside strip 50. The details of the angle strips, the other strips and the pads are shown in FIG. 3, which shows the lower, right quadrant of FIG. 1. As is apparent by reference to FIG. 1, the upper, right quadrant is symmetrical to the lower, right quadrant, with respect to the midline of the cell face perpendicular to the pad-row-parallel sides 26 and 28; the lower, left quadrant is symmetrical to the lower, right quadrant with respect to the midline perpendicular to the pad-row-transverse body sides 30 and 32; and the upper, left quadrant is symmetrical to the lower, right quadrant with respect to the point of intersection of these two midlines.

Figure 4:
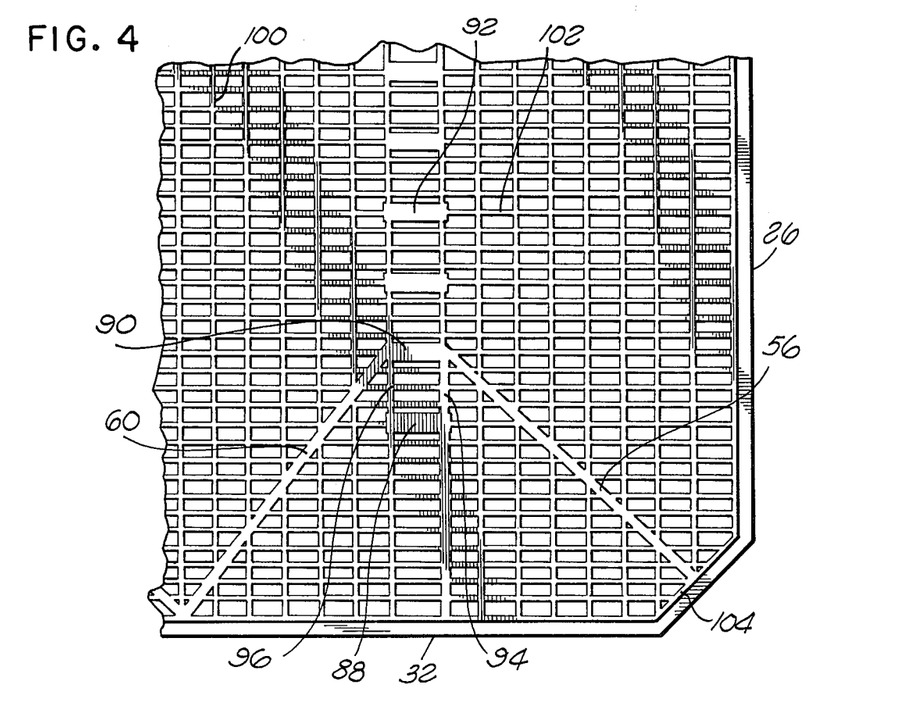
FIG. 4 is an enlarged view of part of FIG. 2.

Still continuing by way of introduction, the rear contact of the solar cell also has sets of strips parallel to the pad-row-parallel body sides 26 and 28, and parallel to the pad-row-transverse body sides 30 and 32, as well as a set of angle strips. It further has a left row of solder pads 52 and a right row of solder pads 54 (with reference to the view of FIG. 2), which run parallel to the pad-row-parallel body sides. Referring to FIG. 2, the set of angle strips consists of a right, lower outside angle strip 56; a right, lower inside angle strip 60; a left, lower outside angle strip 62; a left, lower inside angle strip 64; a left, upper outside angle strip 66; a left, upper inside angle strip 68; a right, upper outside angle strip 70; and a right, upper inside angle strip 72. The details of the rear contact are shown in FIG. 4 which shows the lower, right quadrant of the contact. The symmetry relationships for the rear contact are analogous to those, noted above, for the front contact.

By reference to FIGS. 3 and 4, it will be apparent that the front and rear contacts are similar in certain respects, but different in important details. It will also be apparent that, for both contacts, the details relating to the two pads of each row of pads, which are closest and second closest to each pad-row-transverse body side 30 or 32, particularly draw one's attention.

Figure 6:
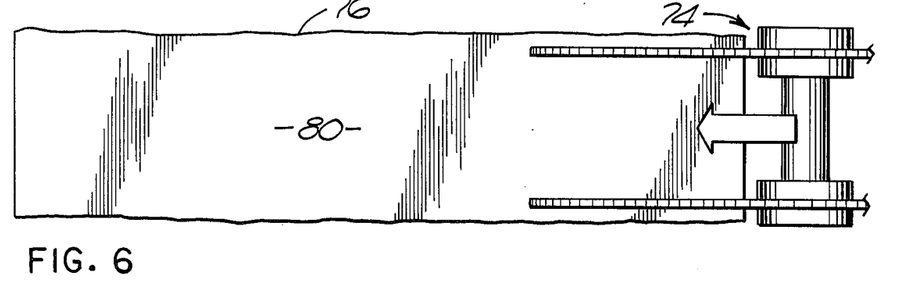
FIG. 6 is a schematic top plan view of a stage in the manufacture of the solar cell of FIG. 1.
Figures 7, 8, 9, 10:
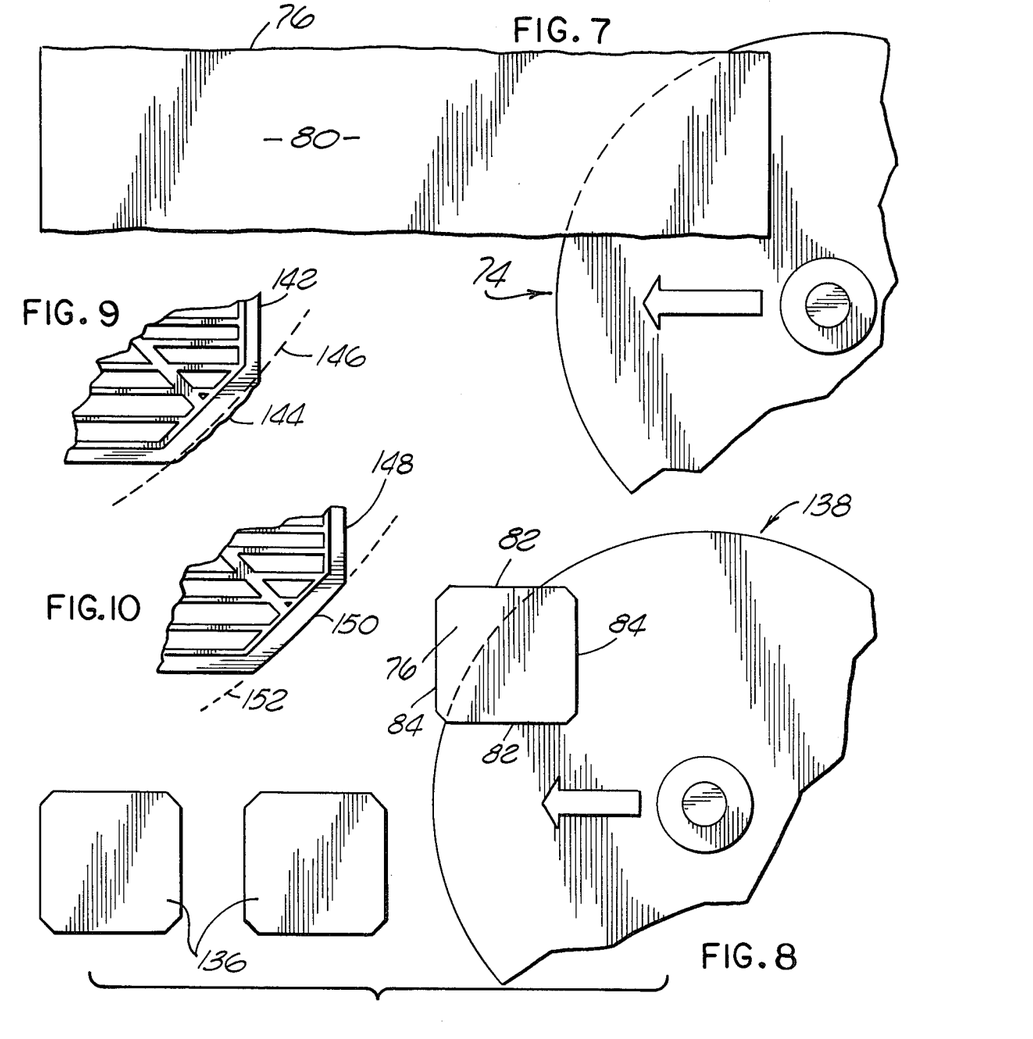
FIG. 7 is a schematic side elevational view of what is shown in FIG. 6.
FIG. 8 is a schematic end elevational view of a subsequent stage of the manufacture process of the cell of FIG. 1.
FIG. 9 shows a corner region, from the front, of another solar cell embodiment which is the same as the cell of FIG. 1, apart from its corner regions.
FIG. 10 shows a corner region, from the front, of a third solar cell embodiment which is the same as the cells of FIGS. 1 and 9, apart from its corner regions.

With reference to the providing of a semiconductor wafter having a shape adapted to the ready providing of the particularly shaped semiconductor body 14 of the solar cell 12, FIGS. 6–8 are pertinent. FIGS. 6 and 7 schematically illustrate a first pass of the blades of a twin-bladed saw 74 along the direction of elongation of a semiconductor ingot 76 through the ingot. The ingot, as is commonly the case with ingots grown by the traditional Czochralski process, has a curved surface 80 along its direction of elongation providing roughly circular-shaped, but slightly irregular cross-sections perpendicular to such direction of elongation. This first pass-through, provided by the twin-bladed saw 74 at two positions (with reference to such cross-sections) equidistant from a nominal diameter for the cross-sections, provides one pair of parallel elongated ingot surfaces. After this first pass-through, the ingot is rotated 90° and there is a second comparable pass-through at positions (with reference to such cross-sections) which are equidistant from a nominal diameter perpendicular to the first diameter. The result is a second pair of elongated ingot surfaces perpendicular to the first pair. The positions for the sawing are chosen to leave small portions of the curved original ingot surface at the corner areas. After some conventional grinding to flatten these corners at angles of 45°, the ingot 76 has the shape shown in FIG. 8. The first, elongated sawed ingot surfaces 82 and the second, elongated sawed ingot surfaces 84 (after the loss of small parts of the surfaces due to the corner grinding) are shown in FIG. 8. Also shown is the sawing of wafers having the shape desired for the bodies of solar cells such as the solar cell 12.

According to one variation, saving a step, the corner flattening can be eliminated, resulting in wafers and solar cells having curved, but somewhat irregular-shaped corner regions, as illustrated in FIG. 9. According to another variation, the corner flattening again can be eliminated and replaced by a circular diameter grinding of the ingot at a diameter designed to round off the somewhat irregular corners to the shape of a circle, as illustrated in FIG. 10.

Now turning to a more detailed consideration, it will be convenient to focus first on the rear contact having the form which is revealed in detail in FIG. 4. As already indicated, the lower, right quadrant of the contact (and rear of the cell) is shown; however, by reference to FIG. 2 showing the complete rear contact (and rear of the cell), as well as by the symmetries indicated previously, FIG. 4 in effect reveals the details of the full rear contact.

In this regard, and with regard to certain very specific details which are included, for ease of description and understanding, it will be assumed that the solar cell 12 of FIGS. 1–5 (apart from the variance due to the corner cut-offs) is approximately 3.825 inches×3.825 inches; that the comparable dimensions between the midlines of the outside strips of the rear contact are 3.725 inches×3.725 inches; and that the comparable dimensions between the midlines of the outside strips of the front contact are 3.705 inches×3.705 inches. Such dimensions and some of the related very specific details have been found to be favorable. However, it will be apparent that the principles which are exemplified can be implemented in numerous variations as to various of the details.

Now focusing on the illustrative portion of the rear contact (and rear of the solar cell) shown in FIG. 4, six identical, rectangular-shaped solder pads of the eleven such identical pads in the right row of solder pads 54 are shown. Of these six, there is an end pad 88 closest to the lower pad-row-transverse body side 32; a second-from-the-end pad 90 second closest to such body side; and four middle pads 92 which form the continuation of the row of pads. An outside pad-row-parallel connector strip 94, which crosses all of the pads of the row of pads, has two different widths along its length. Referring to the figure, the greater width is exhibited where the strip extends to its intersection with the end pad 88 and where it extends between such end pad and the second-from-the-end pad 90. There is also an inside pad-row-parallel connector strip 96 which also crosses each pad of the row and which has only a single width equal to the lesser width of the outside pad-row-parallel connector strip. Fourteen of twenty-seven pad-row-parallel non-connector strips of the contact are also shown in FIG. 4. They are all of a single width equal to that of the inside pad-row-parallel connector strip 96. Thirty-two of a total of sixty-three pad-row-transverse strips having that same, single width are also shown in FIG. 4. Of this, a total of eleven are pad-crossing strips 102, six of which are shown in FIG. 4. The remaining total of fifty-two of the pad-row-transverse strips do not cross any pads; twenty-six of these are shown in FIG. 4. The generally checkerboard pattern resulting from the pad-row parallel strips and from the pad-row-transverse strips, of course, is well evident.

Of the eight angle strips of the rear contact, the right, lower outside angle strip 56 and the right, lower inside angle strip 60 are shown in FIG. 4. These have a single width which is the same as the greater width of the outside pad-row-parallel connector strip 94. Each of these angle strips intersects only a single pad—the second-from-the-end pad 90 of the right row 54. The right, lower outside angle strip is oriented at an angle of 45° with respect to the pad-row-parallel body sides 26 and 28 of the solar cell and with respect to the pad-row-transverse body sides 30 and 32 of the solar cell. The right, lower inside angle strip, runs to the mid-point of the outer pad-row-transverse strip, where it ends. This results in an angle for that angle strip with respect to the pad-row-transverse body sides of about 52°. It will be apparent that the particular form of the rear contact is adapted to the shape of the solar cell 12. It is also particularly adapted to decrease the significance of a misalignment of the connector strip which is soldered along a row of solder pads to connect cells such as the cell 12 in an array. In particular, the form of the contact in the vicinity of the end and second-from-the-end pads in a row minimizes the effect of a missed connection to an end pad by the connector strip. This is considered to be a significant advantage in carrying out a high speed mass-production manufacturing process.

Further with respect to the rear contact, one of a total of four corner strips 104 of the rear contact is shown in FIG. 4. As indicated, it has a single width which is the same as the lesser width of the outside pad-row-parallel connector strip 94. It also intersects the outer ones of the pad-row-parallel and pad-row-transverse strips in the area of the corner. Although in the specific embodiment, the greater of the two strip widths which are present is twice that of the lesser, it is thought that a variation in this factor from about one and one-half to about two and one-half would be reasonable. Also, although the present embodiment incorporates a rear contact which covers about fifteen percent of the area of the rear of the cell, it is thought that some degree of benefit might typically be garnered from a partial, as opposed to a full, rear contact on a solar cell along lines described herein, covering in the range from about five percent to about twenty-five percent of the rear of the cell.

Some specific dimensional information applicable to the specific cell and rear contact dimensions already noted earlier is as follows:

| | |
|---|---|
| Pad length | .200 inch |
| Pad width | .064 inch |
| Pad spacing | .240 inch between midlines |
| Pad row spacing (between inside edges of pads) | 1.425 inches |
| Lesser width of strips or strip portions | .006 inch |
| Greater width of strips or strip portions | .012 inch |
| Space between pad-row-parallel connector strips for a pad row | .0180 inch between midline |
| Spacing between pad-row-parallel non-connector strips | .120 inch between midlines, except .123 inch between the outside such strip and its adjacent strip |
| Spacing between pad-row-parallel connector strip and adjacent pad-row-parallel non-connector strip | .120 inch between midlines |
| Spacing between pad-row-transverse strips | .060 inch between midlines, except .063 inch between outstrip and its adjacent strip |

Now turning to a consideration of the front contact 16 in additional detail, as indicated, the lower, right quadrant of the contact (and of the front of the solar cell) is shown in FIG. 3. As is evident by reference to FIG. 1, and by reference to the symmetry of the front contact noted earlier, the lower, right quadrant of FIG. 3 serves to reveal the details of the complete front contact (and front of the cell).

Referring to FIG. 3, six of eleven solder pads of the right row of solder pads 24 are shown. There is an end pad 106 which is closest to the lower pad-row-transverse body side 32 and a second-from-the-end pad 108 which is second closest to the body side. These two pads are identical. They have a shape which can be described as a central rectangular portion having at each end a portion with the shape of a triangle having its base along the width of the central portion and having its top cut off parallel to its base. Four of seven middle pads 110 of the right row of pads are present in FIG. 3. They are substantially smaller than the end 106 and second-from-the-end 108 pads and are identical to one another. Their shape can be described in the same way as the just-described shape of the end and second-from-the-end pads, with one exception. Because of the dimensional relationships, as compared to the end and the second-from-the-end pads, the central rectangle is rotated 90° so that its length runs in the same direction as the width of the central rectangle of the end and second-from-the-end pads.

The shape of the front pads is chosen with the idea of attempting to relatively maximize the connection of a pad to a connector strip which is misaligned with respect to a row of pads, while attempting to relatively minimize the solar cell surface covered by the pads. By way of example, this can be well appreciated with reference to a somewhat misaligned connector strip having a width that is approximately equal to the length of the side of the rectangular portions of the smaller pads to which the strip is supposed to be perpendicular when not misaligned.

Continuing to refer to FIG. 3, there is an outside pad-row-parallel connector strip 112 having two different widths along its length, the greater being three times as large as the lesser. It extends along the row of pads, for example, in the immediate vicinity of the end 106 and the second-from-the-end 108 pad. It also extends the full dimension of the contact. An end inside pad-row-parallel connector strip 114 extends along the row of pads only near the end and second-from-the end pads. It also has two widths along its length, the lesser being the same as the lesser width of the outside pad-row-parallel connector strip, and the greater being the same as the greater width of such strip. Then, four of a total of seven middle inside pad-row-parallel connector strips 116, for the right pad row, are present in FIG. 3. There is one per middle pad 110 extending along the row near the middle pad. As shown, each has only a single width which is equal to the lesser of the widths of the outside pad-row-parallel connector strip. A pad-row-parallel outside strip 120 in FIG. 3 also has that same, lesser width.

A pad-row-transverse, end-pad-crossing-strip 122, crosses the end pad 106 and, in the immediate vicinity of the end pad, crosses the outside pad-row-parallel connector strip 112 and the end inside pad-row-parallel connector strip 114. It has two widths, the lesser being the same as the lesser width already discussed in connection with other of the strips and the greater being the same as the greater width already discussed. This greater width is exhibited between the just-noted pad-row-parallel connector strips and the end pad. There is also a pad-row-transverse, second-from-the-end pad crossing strip 124. It crosses the second-from-the-end pad 108 and, in the immediate vicinity of such pad, crosses the outside pad-row-parallel connector strip 112 and the end inside pad-row-parallel connector strip 114. It also has the same two thicknesses that have been discussed—the greater thickness being exhibited between such pad-row-parallel connector strips and the pad. With regard to these two pad-row-parallel connector strips, the greater thickness of the outside such strip 112 is exhibited along the portion extending to the pad-row-transverse, end-pad-crossing strip 122 and along the portion between that strip and the pad-row-transverse, second-from-the-end-pad crossing strip 124. The greater thickness of the end inside pad-row-parallel connector strip 114 is also exhibited between these two transverse strips.

Further with regard to pad-row-transverse strips, four of seven pad-row-transverse, middle-pad-crossing strips 126 are present in FIG. 3. They each cross a middle pad 110 in each of the two pad rows. They also each have two widths. The lesser width is the same as the lesser width mentioned in connection with other of the strips. However, the greater of the widths, in this case, is only twice, as opposed to three times, the lesser width. The greater width, in the case of these transverse strips, is exhibited between the outside pad-row-parallel connector strip 112 and the respective middle inside pad-row-parallel connector strip 116. Eighteen of a total of thirty-six pad-row-transverse, non-pad-crossing strips 127 are present in FIG. 3. They each have only a single width therealong which is the same as the lesser width discussed in connection with other of the strips.

The right, lower outside angle strip 34 of FIG. 3 is oriented at an angle of 45° with respect to the pad-row-parallel strips and, of course, then also with respect to the pad-row-transverse strips. The right, lower inside angle strip 36, which runs to the mid-point of the outer pad-row-transverse, non-pad-crossing strip, is at an angle of about 54° with respect to the pad-row-transverse strips. These angle strips have only a single thickness which is equal to twice the lesser thickness that has been noted in connection with other of the strips. It is noteworthy that the right, lower outside angle strip 34 extends in the immediate vicinity of the second-from-the-end pad 108, where it intersects the outside pad-row-parallel connector strip 112; and the right, lower inside angle strip 36 also extends in the immediate vicinity of this pad, on the pad's other side, where the strip intersects the end inside pad-row-parallel connector strip 114. The larger size of the end 106 and the second-from-the-end 108 pad, as compared to the middle pads 110, is considered a significant advantage in addressing the misalignment of connector strips which are to be soldered along the pad rows. The particular form of the contact as it relates to the vicinities of these two pads is also considered a significant advantage in minimizing the significance of the end pad 106, in the event it is lost as a connection point due to such a misalignment. The specific embodiment, as indicated, has strip width ratios of 1:2:3. However, it is thought that ratios for the two larger widths, with respect to the smallest width, of in the range from about $1\frac{1}{2}$ to $2\frac{1}{2}$ and from about $2\frac{1}{2}$ to $3\frac{1}{2}$, respectively, might be usefully employed. A corner strip 128 shown in FIG. 3 has a single width which is the smallest of the widths which have been discussed in connection with other of the strips. The corner strip intersects the pad-row-parallel outside strip 120 and the outside one of the pad-row-transverse-non-pad-crossing strips 126.

Some specific front contact dimensional information applicable to the specific cell having other specific dimensional information (including that for the rear contact) noted earlier is as follows:

| | |
|---|---|
| Length of end and second-from-the-end pad rectangle portions | .100 inch |
| Width of end and second-from-the-end pad rectangle portions | .064 inch |
| Full dimension of end and second-from-the-end pads along direction of rectangle portion length | .150 inch |
| Width of middle pad rectangle portions | .050 inch |
| Length of middle pad rectangle portions | .064 inch |
| Full dimension of middle pads along direction of rectangle portion width | .100 inch |
| Pad spacing | .240 inch between midlines |
| Pad row spacing (between inside edges of pads) | 1.475 inch |
| Lesser of the three strip widths | .006 inch |
| Greatest of the three strip widths | .018 inch |
| Third of the three strip widths | .012 inch |
| Spacing between Pad-row-transverse strips | .080 inch between midlines, except .086 inch between outside strip and its adjacent strip |
| Spacing between inside edge of outside pad-row-parallel connector strip and outside edge of end pad | .054 inch |

The cross-sectional view of FIG. 5 of the solar cell 12 reveals a conventional two-layer body form. As is considered advantageous with contacts as described, the body for the embodiment is a silicon semiconductor body having an upper N-type layer and a base P-type layer. Of course, other forms and semiconductor materials may also be employed with contacts of this type.

Referring to FIG. 5, there is a negative-conductivity N-type layer 130 and a positive-conductivity P-type layer 132 which are joined at a P/N junction 134. The body might typically have a thickness in the range of about 300 microns, with the N-type layer having a thickness in the range of about 0.3 to 0.5 microns. Typical advantangeous resistivities for the P-type and N-type layers are in the range of about 0.5 ohm-centimeter and 5.0 ohm-centimeter, respectively. It, of course, will be apparent that variations can be readily employed. The technique of producing a semiconductor body such as that of FIG. 5 from, for example, a wafer of P-type semiconductor material is well known and well understood by those knowledgeable in the art and forms no part of the present invention. However, several of the stages of a procedure for providing such a wafer having the particular, desired shape, from an ingot of semiconductor material, are illustrated in FIGS. 6–8.

That procedure and these figures, as well as some variations, have already been discussed in some, considerable detail in the initial portion hereof. However, some additional matters are worthy of note in this regard. A twin bladed rotating saw 74 is shown in FIGS. 6 and 7, for cutting the ingot 76 along its direction of elongation. Such a saw, conventionally constructed, most typically will be charged with diamond particles therealong. Of course, other saws and sawing techniques could readily be used. Just by way of example as to the possible variations, a slurry saw having a single blade and making only one, rather than two, of the cuts at a time could readily be employed. In FIG. 6, the twin-bladed saw is indicated to be moving (with the ingot stationary). However, the appropriate relative translational movement between the ingot and the saw blades, of course, could also be provided by movement of the ingot. The ingot portions removed by the sawing along the direction of elongation of the ingot can be immediately returned to the melt which is used in forming ingots. This is both convenient and efficient.

As previously noted, the positions for the cutting along the direction of elongation of the ingot are chosen so as to leave small portions of the curved original ingot surface at the corner areas. Then the curved corner regions of the ingot are flattened by conventional grinding.

Referring to FIG. 8, it illustrates the cutting of the desirably shaped individual wafers from the ingot by the repeated sawing through the ingot transversely to the direction of elongation of the ingot. Two wafers 136 which have already been sawed are shown and a third wafer is in the process of being sawed. A single-bladed rotating saw 138, which moves to successive positions along the ingot, to saw successive wafers, is shown. Again, such a saw, conventionally constructed, most typically will be charged with diamond particles; and rather than movement of the saw into and through the ingot in cutting (indicated in FIG. 8), and then along the ingot to a next cutting position (assumed in FIG. 8), movement of the ingot could be employed in both cases. Other conventional saws, such as a slurry saw, could readily be used, as well as multi-bladed saws.

As an alternative already noted, the flattening step of FIGS. 6–8 could be eliminated. This is illustrated in FIG. 9 which shows a corner region of a resulting cell, from the front. This cell 142 is the same, in all respects, as the cell 12 of FIGS. 1–5, apart from its corner regions. The curved, somewhat irregular shape of the lower, right corner region 144, is the shape of the outer surface of the ingot at the point at which the wafer for the cell was sawed from the ingot. (The three other corner regions (not shown), of course, are comparable to the corner region shown.) It is noteworthy that this variation both eliminates any grinding to accomplish the corner flattening and any outer diameter grinding which is typically done on an ingot such as the ingot 76 to make its somewhat irregular outer surface more exactly circular. The dashed line 146 of FIG. 9 represents the more exact circular shape.

FIG. 10 illustrates another alternative already noted. Specifically, it illustrates the alternative of eliminating the corner flattening step of FIGS. 6–8, but replacing it with such an outer diameter grinding done after the ingot has been sawed to provide the two sets of elongated surfaces. In this case, the grinding, of course, will only affect the corner regions, rounding them off to a circular shape. FIG. 10 shows a corner region of a cell, from the front, resulting from this variation. This cell 148 is the same, in all respects, as the cell 12 and the cell 142 of FIGS. 1–5 and FIG. 9, respectively, apart from its corner regions. Here, the corner region 150 follows the circular shape represented by the dashed line 152. (The three other corner regions (not shown) of course are essentially the same as the corner region shown.) Of course, the same result could be accomplished by carrying out an outer diameter grinding on an ingot before the sawing to provide the sets of elongated surfaces (as illustrated in FIGS. 6 and 7) is carried out.

The crystal ingot 76 of FIGS. 6-8 for a material such as silicon, will typically be formed with a [001] type of crystal orientation. The concept of a crystal orientation for an ingot of a material with a face-centered-cubic structure, such as silicon, is well understood by those skilled in the art. In accordance with this understanding, planes in the [001] grouping of planes will be perpendicular to the direction of elongation of the ingot; thus, the sawing of such an ingot transverse to that direction to form wafers will be along such planes. This orientation is convenient for the texturing of surfaces of bodies, such as the body 14, formed from a wafer of the ingot. In this respect, texturing of both the front and the rear surfaces of the body of the solar cell 12 is considered to be advantageous.

It should be noted that in the sense used herein and in the art, the class of [001] planes is considered not limited by a choice of origin, but encompasses the planes falling in the [001] plane system for a selected origin, and all equivalent planes from a crystallographic standpoint.

Turning back to the detailed features of the front 16 and rear 20 contacts, as shown in FIGS. 1-5 and described, such contacts are conveniently formed by screen printing a paste in the desired pattern on the front and rear of the solar cell body. A microfilm fine emulsion applied with a thickness of about 0.0005 inch works well. The front and rear contacts can then be fired concurrently in an open-tube belt furnace by running the cell through the furnace, e.g., for a period of about three seconds while the furnace is at about 640° to 645° C. The following composition, for the rear contact paste, has similarly given favorable results:
silver powder—about 73% by weight
aluminum powder—about 2% by weight
borosilicate glass frit—about 4% by weight
butyl carbitol or terpineol (solvent)—about 16% by weight
ethyl cellulose (organic binder)—about 5% by weight
Substantially the same composition, with the exception that the aluminum powder is totally eliminated, has provided favorable results for the front contact. The capability for use of a printing process, while still providing a good bond, particularly between the rear contact and a P-type base layer is considered to be particularly advantageous when compared, for example, to an evaporation process for applying a contact.

It will be appreciated that many changes in the product and method embodiments which have been described in detail herein, may be made without departing from the scope or spirit of the invention.

What is claimed is:

1. A solar cell comprising:
a semiconductor body to receive solar radiation and convert said radiation to electrical energy, said body having a first pair of opposed substantially parallel sides and a second pair of opposed substantially parallel sides, substantially perpendicular to said first pair of sides;
a front electrical contact for said body; and
a rear electrical contact for said body forming an intersecting pattern including a plurality of rows of solder pads substantially parallel to said first pair of sides, a first set of strips substantially parallel to said first pair of sides, a second set of strips substantially parallel to said second pair of sides, a third set of strips angularly oriented with respect to said first and second pairs of sides and a fourth set of strips substantially parallel to said first pair of sides, each strip of said fourth set of strips extending in the immediate vicinity of at least the two pads of a said row of pads closest to a side of said second pair of sides.

2. A solar cell as defined in claim 1 wherein the strips of said first and second sets of strips are of substantially a single, first width and the strips of said third set of angularly oriented strips are of substantially a single, second width.

3. A solar cell as defined in claim 1 wherein the strips of said first and second sets of strips are of substantially a single, first width, the strips of said third set of angularly oriented strips are of substantially a single, second width and said second width is equal to said first width multiplied by a factor in the range of from about one and one-half to two and one-half.

4. A solar cell as defined in claim 1 wherein the strips of said first and second sets of strips are of substantially a single, first width and at least portions of said strips of said fourth set of strips between said two pads of a said row of pads are of a single, second width.

5. A solar cell as defined in claim 1 wherein the strips of said first and second sets of strips are of substantially a single, first width and at least portions of said strips of said fourth set of strips between said two pads of a said row of pads are of a single, second width and said second width is equal to said first width multiplied by a factor in the range of from about one and one-half to two and one-half.

6. A solar cell as defined in claim 1 wherein each strip of said third set of angularly oriented strips extends in the immediate vicinity of the pad of a said row of pads disposed second closest to a side of said second pair of sides.

7. A solar cell as defined in claim 6 wherein each strip of said third set of angularly oriented strips intersects the respective second closest pad.

8. A solar cell as defined in claim 1 wherein each side of said first and second pairs of sides has substantially the same length.

9. A solar cell as defined in claim 1 wherein said semiconductor body substantially has the shape of a square having its corners cut off at an angle of about 45 degrees.

10. A solar cell as defined in claim 1 wherein said semiconductor body substantially has the shape of a square having its corners curved.

11. A solar cell as defined in claim 1 wherein said semiconductor body substantially has the shape of a square having its corners rounded to a circular shape.

12. A solar cell as defined in claim 1 wherein said first set of strips comprises at least three strips and said second set of strips comprises at least three strips.

13. A solar cell as defined in claim 1 wherein said front electrical contact for said body forms an intersecting pattern including a plurality of rows of pads substantially parallel to said first pair of sides and a set of strips substantially parallel to said second pair of sides.

14. A solar cell comprising:
a semiconductor body to receive solar radiation and convert said radiation to electrical energy, said body having a first pair of opposed substantially parallel sides and a second pair of opposed substantially parallel sides, substantially perpendicular to said first pair of sides;

a front electrical contact for said body forming an intersecting pattern including a plurality of rows of solder pads substantially parallel to said first pair of sides, a first set of strips substantially parallel to said first pair of sides, a second set of strips substantially parallel to said second pair of sides, a third set of strips angularly oriented with respect to said first and second pairs of sides and a fourth set of strips substantially parallel to said first pair of sides, each strip of said fourth set of strips extending in the immediate vicinity of at least each of the two pads of a said row of pads closest to a side of said second pair of sides; and a rear electrical contact for said body.

15. A solar cell as defined in claim 14 wherein the strips of said second set of strips are of substantially a single, first width and the strips of said third set of angularly oriented strips are of substantially a single, second width.

16. A solar cell as defined in claim 14 wherein the strips of said second set of strips are of substantially a single, first width, the strips of said third set of angularly oriented strips are of substantially a single, second width and said second width is equal to said first width multiplied by a factor in the range of from about one and one-half to two and one-half.

17. A solar cell as defined in claim 14 wherein said front electrical contact intersecting pattern further includes a fifth set of strips substantially parallel to said second pair of sides, each intersecting a pad of at least one of said plurality of rows of pads and intersecting at least one of said strips of said fourth set of strips in said immediate vicinity of one of said two pads.

18. A solar cell as defined in claim 14 wherein the strips of said second set of strips are of substantially a single, first width and at least portions of said strips of said fourth set of strips are of substantially a single, second width.

19. A solar cell as defined in claim 14 wherein the strips of said second set of strips are of substantially a single, first width, at least portions of said strips of said fourth set of strips are of substantially a single, second width and said second width is equal to said first width multiplied by a factor in the range of from about two and one-half to three and one-half.

20. A solar cell as defined in claim 14 wherein the strips of said second set of strips are of substantially a single, first width, the strips of said third set of angularly oriented strips are of substantially a single, second width and at least portions of said strips of said fourth set of strips are of substantially a single, third width.

21. A solar cell as defined in claim 14 wherein each strip of said third set of strips extends in the immediate vicinity of the pad of a said row of pads disposed second closest to a side of said second pair of sides.

22. A solar cell as defined in claim 14 wherein each side of said first and second pairs of sides has substantially the same length.

23. A solar cell as defined in claim 14 wherein said semiconductor body substantially has the shape of a square having its corners cut off at an angle of about 45 degrees.

24. A solar cell as defined in claim 14 wherein said semiconductor body substantially has the shape of a square having its corners curved.

25. A solar cell as defined in claim 14 wherein said semiconductor body substantially has the shape of a square having its corners rounded to a circular shape.

26. A solar cell as defined in claim 14 wherein said rear electrical contact for said body forms and intersecting pattern including a plurality of rows of pads substantially parallel to said first pair of sides, a first set of strips substantially parallel to said first pair of sides and a second set of strips substantially parallel to said second pair of sides.

27. A solar cell comprising:
a semiconductor body to receive solar radiation and and convert said radiation to electrical energy, said body having a first pair of opposed substantially parallel sides and a second pair of opposed substantially parallel sides, substantially perpendicular to said fist pair of sides;
a front electrical contact for said body; and
a rear electrical contact for said body forming an intersecting pattern including a plurality of rows of solder pads substantially parallel to said first pair of sides, a first set of strips substantially parallel to said first pair of sides, a second set of strips substantially parallel to said second pair of sides, and a third set of strips angularly oriented with respect to said first and second pairs of sides, each strip of said third set of angularly oriented strips extending in the immediate vicinity of the pad of a said row of pads disposed second closest to a side of said second pair of sides.

28. A solar cell as defined in claim 27 wherein each strip of said third set of angularly oriented strips extends from substantially away from said rows of pads to the immediate vicinity of the pad of a said row of pads disposed second closest to a side of said second pair of sides.

29. A solar cell as defined in claim 27 wherein each strip of said third set of angularly oriented strips intersects the respective second closest pad.

30. A solar cell as defined in claim 27 wherein said first and second sets of strips are of substantially a single first width and said third set of angularly oriented strips are of substantially a single, second width.

31. A solar cell comprising:
a semiconductor body to receive solar radiation and and convert said radiation to electrical energy, said body having a first pair of opposed substantially parallel sides and a second pair of opposed substantially parallel sides, substantially perpendicular to said first pair of sides;
a front electrical contact for said body; and
a rear electrical contact for said body forming an intersecting pattern including a plurality of rows of solder pads substantially parallel to said fist pair of sides, a first set of strips substantially parallel to said first pair of sides, a second set of strips substantially parallel to said second pair of sides, a third set of strips angularly oriented with respect to said first and second pairs of sides and a fourth set of strips substantially parallel to said first pair of sides, each strip of said fourth set of strips intersecting at least the two pads of a said row of pads closest to a side of said second pair of sides.

32. A solar cell comprising:
a semiconductor body to receive solar radiation and convert said radiation to electrical energy, said body having a first pair of opposed substantially parallel sides and a second pair of opposed substantially parallel sides, substantially perpendicular to said first pair of sides;

a front electrical contact for said body forming an intersecting pattern including a plurality of rows of solder pads substantially parallel to said first pair of sides, a first set of strips substantially parallel to said first pair of sides, a second set of strips substantially parallel to said second pair of sides and a third set of strips angularly oriented with respect to said first and second pairs of sides, each strip of said third set of angularly oriented strips extending in the immediate vicinity of the pad of a said row of pads disposed second closest to a side of said second pair of sides;

a rear electrical contact for said body.

33. A solar cell as defined in claim 32 wherein each strip of said third set of angularly oriented strips extends from substantially away from said rows of pads to the immediate vicinity of the pad of a said row of pads disposed second closest to a side of said second pair of sides.

34. A solar cell as defined in claim 32 wherein the strips of said second set of strips are of substantially a single, first width and the strips of said third set of angularly oriented set of strips are of substantially a single, second width.

* * * * *